United States Patent
Kurashige

(10) Patent No.: US 9,703,182 B2
(45) Date of Patent: Jul. 11, 2017

(54) PROJECTION APPARATUS

(71) Applicant: DAI NIPPON PRINTING CO., LTD., Tokyo-To (JP)

(72) Inventor: Makio Kurashige, Tokyo (JP)

(73) Assignee: Dai Nippon Printing Co., Ltd., Shinjuku-Ku (JP)

(*) Notice: Subject to any disclaimer, the term of this patent is extended or adjusted under 35 U.S.C. 154(b) by 0 days.

(21) Appl. No.: 14/353,897

(22) PCT Filed: Oct. 12, 2012

(86) PCT No.: PCT/JP2012/076416
§ 371 (c)(1),
(2) Date: Apr. 24, 2014

(87) PCT Pub. No.: WO2013/061803
PCT Pub. Date: May 2, 2013

(65) Prior Publication Data
US 2014/0253989 A1    Sep. 11, 2014

(30) Foreign Application Priority Data
Oct. 27, 2011    (JP) .................................. 2011-236364

(51) Int. Cl.
*G03B 21/00* (2006.01)
*G03B 21/14* (2006.01)
(Continued)

(52) U.S. Cl.
CPC ......... *G03B 21/147* (2013.01); *G02B 26/101* (2013.01); *G02B 27/48* (2013.01);
(Continued)

(58) Field of Classification Search
USPC ...... 359/15, 707, 316, 229; 353/37, 31, 121; 345/691, 88; 355/67; 332/109
See application file for complete search history.

(56) References Cited

U.S. PATENT DOCUMENTS 6,594,090 B2 *   7/2003  Kruschwitz et al. .......... 359/707
8,016,428 B2 *   9/2011  Kasazumi et al. .............. 353/37
(Continued)

FOREIGN PATENT DOCUMENTS

GB    2 456 170 A    7/2009
JP    06-208089      7/1994
(Continued)

OTHER PUBLICATIONS

Goodman, Joseph W., "*Speckle Phenomena in Optics,*" Roberts & Company, 2006 (48 pages).
(Continued)

*Primary Examiner* — Audrey Y Chang
(74) *Attorney, Agent, or Firm* — Burr & Brown, PLLC

(57) ABSTRACT

A projection apparatus has an optical device capable of diffusing coherent light beams, an irradiation unit to irradiate coherent light beams to the optical device so that the coherent light beams scan the optical device, a light modulator to generate a modulated image using coherent light beams incident on and diffused at respective points of the optical device from the irradiation unit, and a projection optical system to project a modulated image generated by the light modulator onto a scattering plane. The light modulator has a plurality of micromirrors provided for each pixel, to switch a reflection angle of each coherent light beam from the optical device, and a reflection angle controller to control a timing of switching a reflection angle of each of the plurality of micromirrors so that the timing becomes irregular for each frame period that is a time unit for generating the modulated image.

8 Claims, 10 Drawing Sheets

(51) Int. Cl.
- *H04N 9/31* (2006.01)
- *H03K 7/08* (2006.01)
- *G02B 27/48* (2006.01)
- *G03B 21/20* (2006.01)
- *G03B 33/06* (2006.01)
- *G02B 26/10* (2006.01)

(52) U.S. Cl.
CPC ......... *G03B 21/008* (2013.01); *G03B 21/208* (2013.01); *G03B 21/2033* (2013.01); *G03B 33/06* (2013.01); *H03K 7/08* (2013.01); *H04N 9/3135* (2013.01); *H04N 9/3164* (2013.01); *H04N 9/3197* (2013.01)

(56) References Cited

U.S. PATENT DOCUMENTS

| | | | | |
|---|---|---|---|---|
| 8,179,591 | B2 * | 5/2012 | Sugimoto | G02B 26/0841 359/316 |
| 8,184,136 | B2 * | 5/2012 | Tokui | 345/691 |
| 8,633,779 | B2 * | 1/2014 | Pfaffinger | H03K 7/08 332/109 |
| 8,792,081 | B2 * | 7/2014 | Owa | 355/67 |
| 2009/0033808 | A1 | 2/2009 | Maeda et al. | |
| 2009/0128786 | A1 * | 5/2009 | Lieb | G03B 21/14 353/121 |
| 2009/0128888 | A1 * | 5/2009 | Ichikawa | G09G 3/346 359/295 |
| 2013/0077057 | A1 | 3/2013 | Kurashige et al. | |

FOREIGN PATENT DOCUMENTS

| | | |
|---|---|---|
| JP | 2004-264512 A | 9/2004 |
| JP | 2008-071672 A | 3/2008 |
| JP | 4688980 B1 | 5/2011 |
| WO | 94/09473 A1 | 4/1994 |
| WO | 2010/080697 A1 | 7/2010 |

OTHER PUBLICATIONS

International Search Report, (With English Translation) International Application No. PCT/JP2012/076416, dated Nov. 13, 2012 (3 pages).

Extended European Search Report (Application No. 12843674.8) dated May 7, 2015.

* cited by examiner

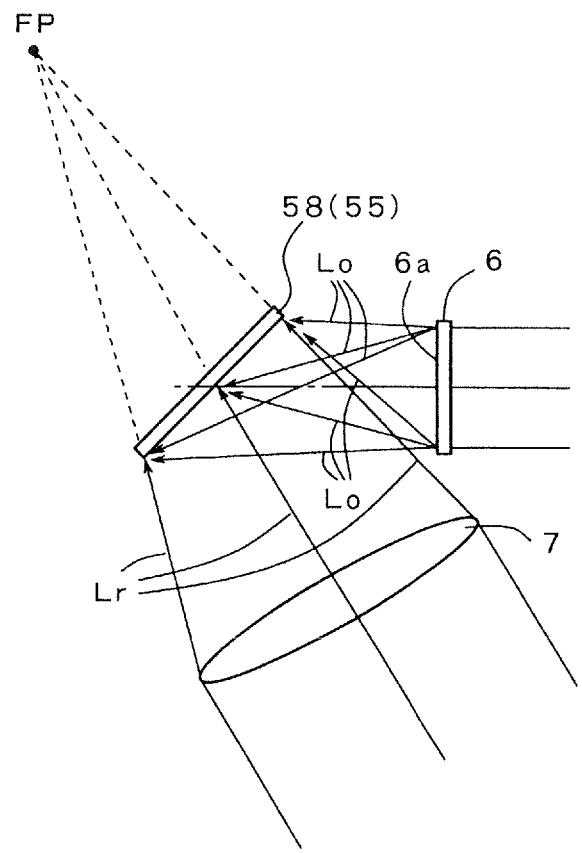
F I G. 2
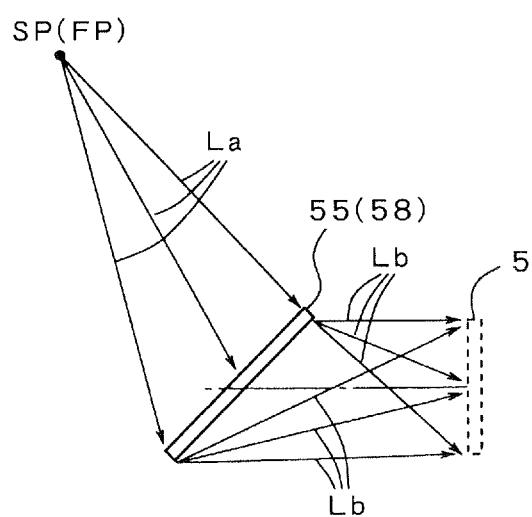
F I G. 3

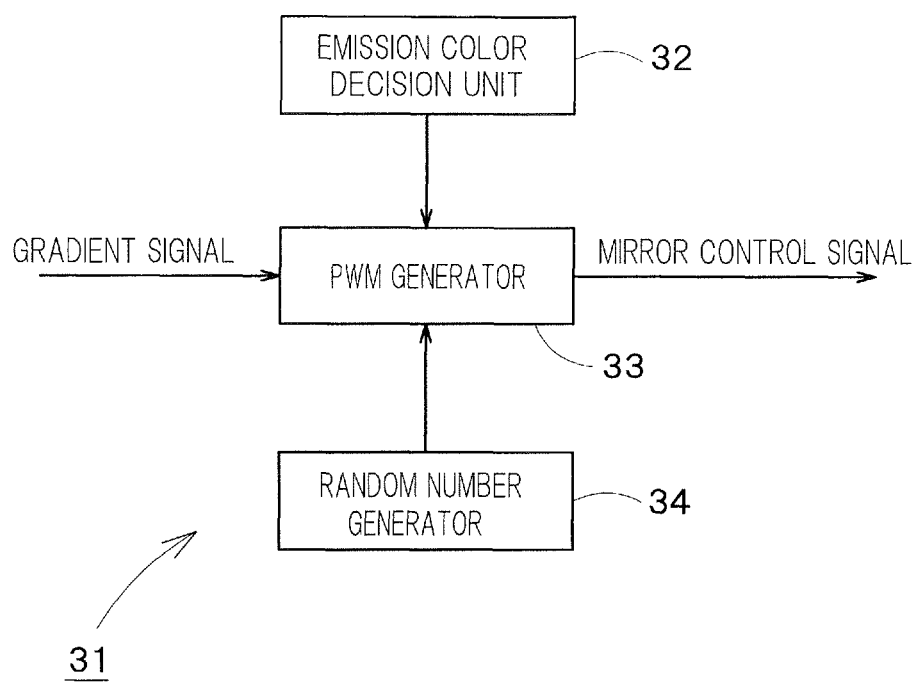
F I G. 6

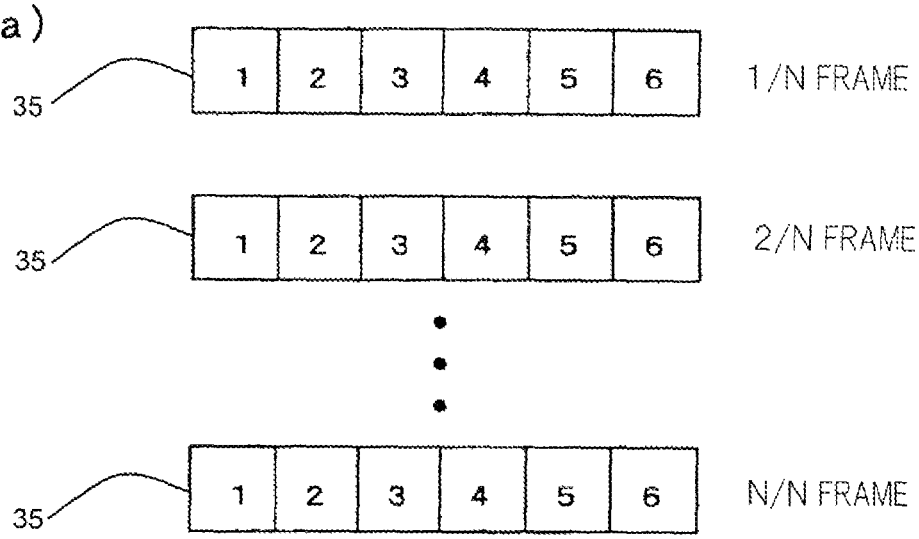
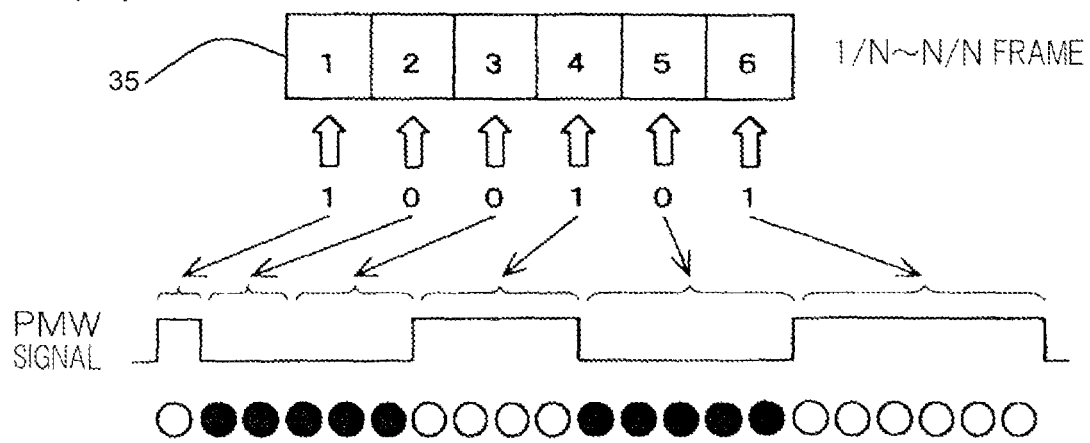
F I G. 7

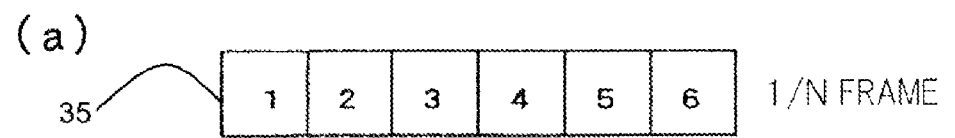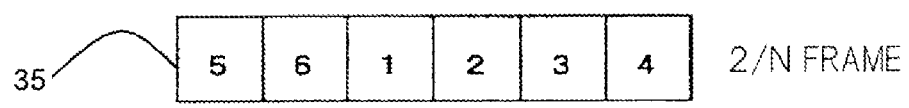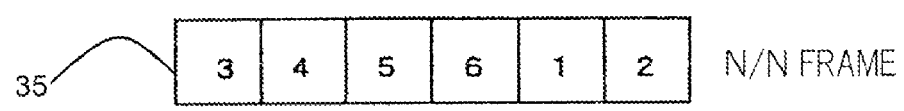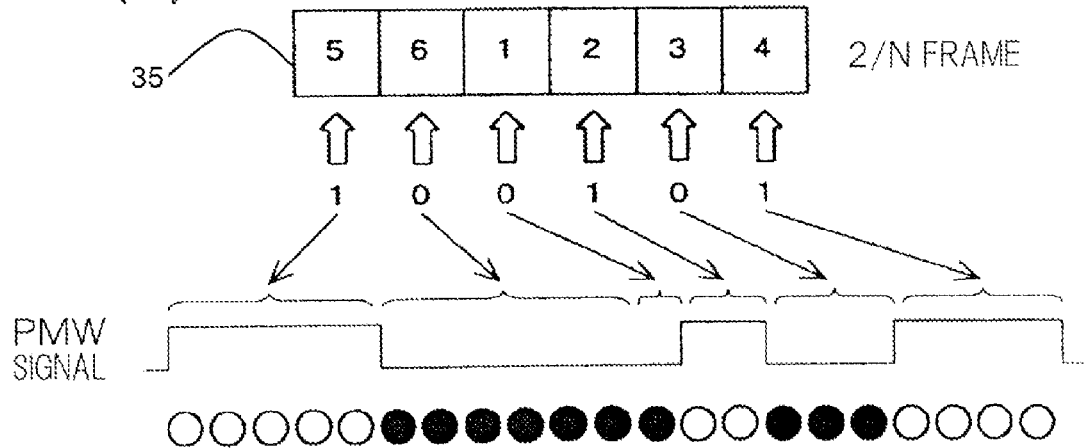
F I G. 8

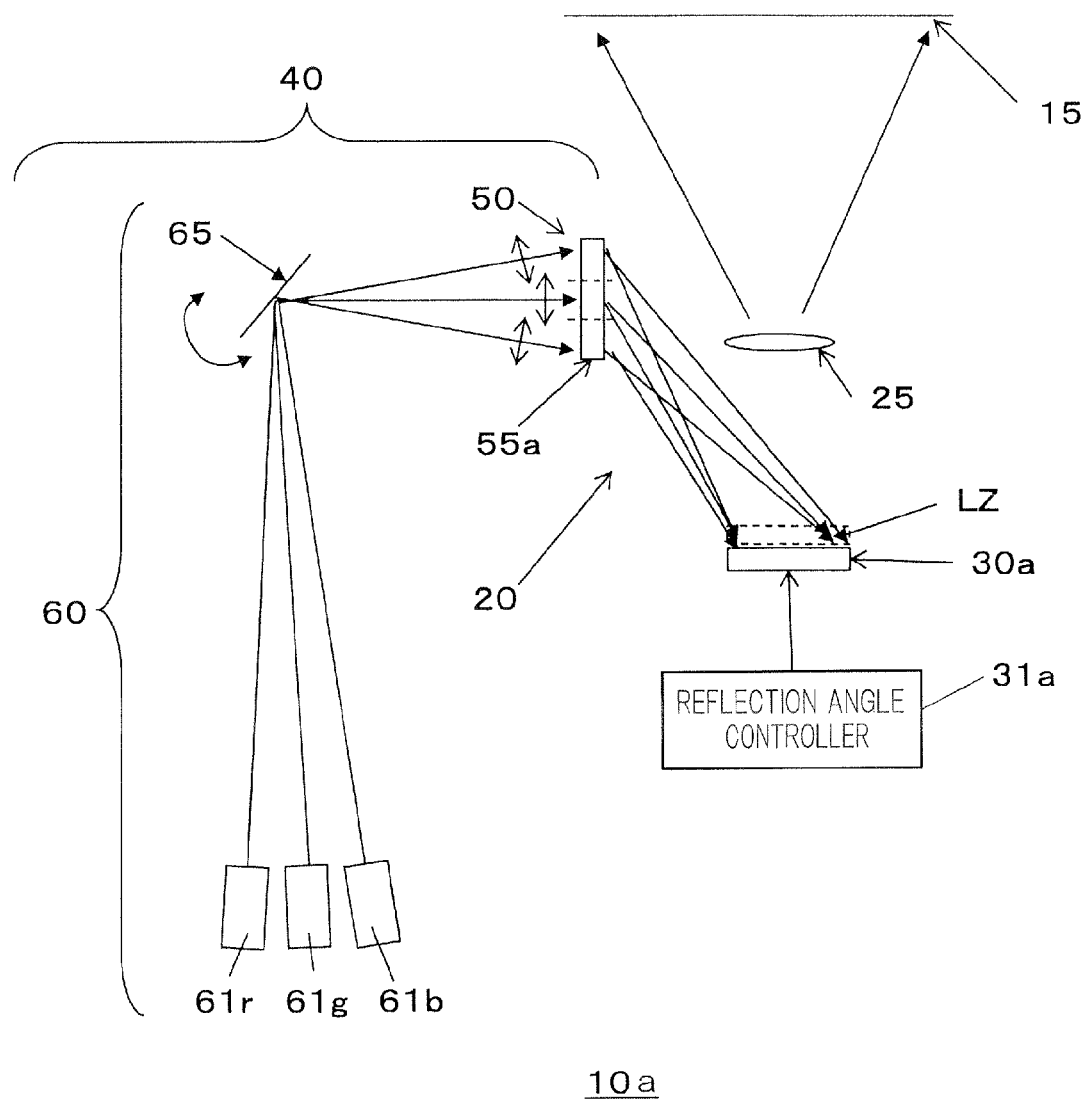
F I G. 10

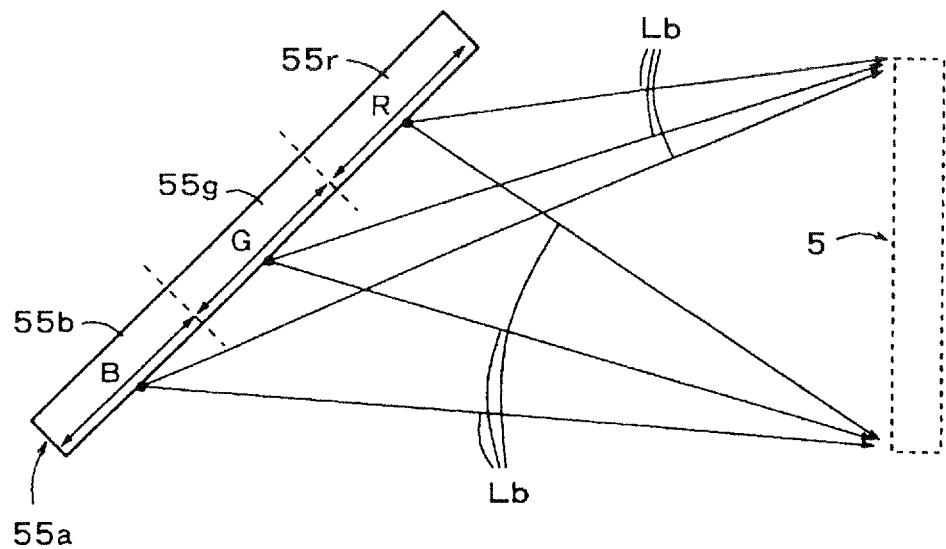
F I G. 11
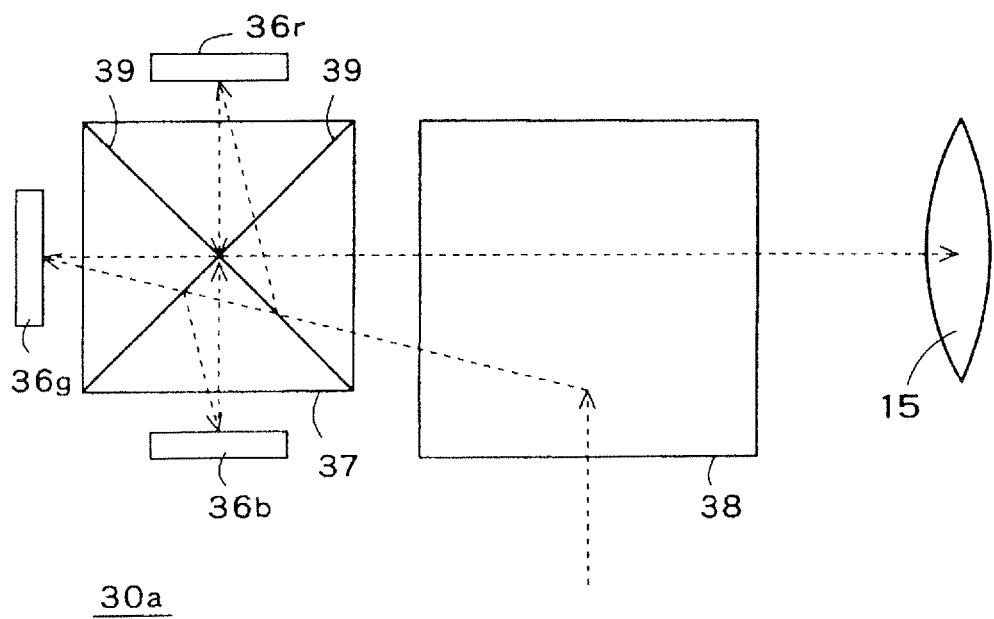
F I G. 12

PROJECTION APPARATUS

BACKGROUND OF THE INVENTION

1. Field of the Invention

The present invention relates to a projection apparatus capable of making speckles inconspicuous.

2. Description of Related Art

Projection-type image display apparatuses having a screen and a projection apparatus which projects light beams of an image onto the screen have been widely used. In a typical projection-type image display apparatus, a two-dimensional image is created as a basic image using a spatial light modulator such as a liquid crystal microdisplay or a DMD (Digital Micromirror Device), and then the two-dimensional image is magnified and projected onto a screen using a projection optical system, so that an image is displayed on the screen.

As projection apparatuses, various types including a commercialized product called an "optical projector" have been proposed. In general optical projectors, a spatial light modulator such as a liquid crystal display is illuminated using an illumination device having a white light source such as a high pressure mercury lamp to obtain a modulated image, and the obtained modulated image is magnified and projected onto a screen through lenses. For example, Japanese Patent Laid-Open No. 2004-264512 discloses a technique to divide white light generated by a super-high pressure mercury lamp into three primary color components R, G, and B with a dichroic mirror, guide these light beams to spatial light modulators corresponding to the respective primary colors to create modulated images, and combine the created modulated images corresponding to the respective primary colors by a cross dichroic prism, to project the images onto a screen.

However, high intensity discharge lamps such as high pressure mercury lamps have a short lifecycle and when they are used for optical projectors or the like, they need to be frequently replaced. In addition, since a relatively large optical system such as a dichroic mirror is needed to extract light beams of the respective primary color components, there is a problem in that the entire system becomes larger.

In order to cope with such problems, a system using a coherent light source such as a laser has also been proposed. For example, semiconductor lasers which have been widely used in industries have a very long lifecycle in comparison with high intensity discharge lamps such as high pressure mercury lamps. In addition, since semiconductor lasers are capable of generating light of a single wavelength, a color separation apparatus such as a dichroic mirror is unnecessary, so that there is an advantage in that the entire system becomes smaller.

On the other hand, in the system using a coherent light source of laser beams or the like, there is a new problem in that speckle is generated. Speckle is a spotted pattern which is formed when a coherent light beam such as a laser beam is emitted to a scattering plane. If speckle is generated on a screen, they are observed as spotted luminance unevenness, i.e. brightness unevenness, thus becoming a factor of having physiologically adverse affect on an observer. It is considered that the reason why speckle is generated in the case of using coherent light beams is that coherent light beams reflected from respective portions of a scattering and reflecting plane such as a screen have very high coherency so that coherent light beams interfere with one another to generate speckles. For example, a theoretical review of the generation of speckles is made in detail in Speckle Phenomena in Optics, Joseph W. Goodman, Roberts & Co., 2006.

As discussed above, a coherent light source has a unique problem in that the speckle is generated. Therefore, techniques for suppressing the generation of speckle have been proposed. For example, Japanese Patent Laid-Open No. 6-208089 discloses a technique in which a laser beam is emitted to a scattering plate, scattered light beams obtained therefrom are guided to a spatial light modulator, and the scattering plate is driven to rotate by a motor, thus reducing speckles.

SUMMARY OF THE INVENTION

As described above, with respect to projection apparatuses using a coherent light source, techniques for reducing speckles have been proposed, however, the techniques proposed so far cannot effectively and sufficiently suppress the generation of speckles. For example, according to the method disclosed in Japanese Patent Laid-Open No. H6 (1994)-208089 described above, laser beams irradiated to a scattering plate are scattered. Therefore, part of the laser beams is inevitably lost with no contribution to image display. In addition, a scattering plate needs to be rotated in order to reduce speckles. However, such a mechanical rotation mechanism becomes a relatively large apparatus, and power consumption is increased. Moreover, even if the scattering plate is rotated, the position of the optical axis of an illumination light beam is not changed, hence it is impossible to sufficiently suppress the generation of speckles caused by the diffusion on a screen.

Coherent light beams, for example laser beams as a typical example, have excellent straightness and can emit a light of extremely high energy density. Therefore, illumination devices actually developed are preferable to design the optical path of coherent light beams in accordance with the characteristics of coherent light beams.

When a DMD (Digital Micromirror Device) is used as a spatial light modulator, it is required to switch the reflection angle of a micromirror corresponding to each pixel for each frame period. In more practically, it is considered that a pulse-width modulation signal for controlling the amount of reflected light from a micromirror is generated and the pulse width and the pulse generation time of the pulse-width modulation signal are switched for each frame period.

However, when the switching timing of the micromirror reflection angle is constant even if the frame changes, light from a micromirror reaches a projection screen always at the same time in respective frames, which leads to constant generation of speckles.

The inventors have extensively researched under consideration of the points discussed above, and as a result, the inventors have contrived the invention regarding a projection apparatus for projecting a modulated image created using coherent light beams that are diffracted by a hologram recording medium or the like. Moreover, the inventors have proceeded with researches and succeeded in improvement in the projection apparatus to constantly prevent the generation of a region extremely bright in creation of a modulated image using coherent light beams that are diffracted by a hologram recording medium. Namely, the purpose of the present invention is to provide a projection apparatus capable of making speckles inconspicuous irrespective of gradient and effectively suppressing the generation of brightness unevenness in use of a spatial light modulator having a plurality of micromirrors each capable of switching the reflection angle.

In order to solve the problems above, according to an aspect of the present invention, there is provided a projection apparatus comprising:

an optical device configured to be capable of diffusing coherent light beams;

an irradiation unit configured to irradiate coherent light beams to the optical device so that the coherent light beams scan the optical device;

a light modulator configured to generate a modulated image using coherent light beams incident on and diffused at respective points of the optical device from the irradiation unit; and a projection optical system configured to project a modulated image generated by the light modulator onto a scattering plane, wherein the light modulator comprises:

a plurality of micromirrors provided for each pixel, configured to switch a reflection angle of each coherent light beam from the optical device; and a reflection angle controller configured to control a timing of switching a reflection angle of each of the plurality of micromirrors so that the timing becomes irregular for each frame period that is a time unit for generating the modulated image.

According to the present invention, it is possible to effectively make speckles inconspicuous on a projection screen irrespective of gradient levels even when a plurality of micromirrors for each of which the reflection angle is adjusted are provided in a spatial light modulator.

BRIEF DESCRIPTION OF DRAWINGS

FIG. 2 is a view explaining a state in which an image of a scattering plate is generated on a hologram recording medium 55 as interference fringes;

FIG. 3 is a view explaining a state in which an image of a scattering plate is reproduced using interference fringes formed in the hologram recording medium 55 obtained through an exposure process of FIG. 2;

FIG. 6 is a block diagram showing an example of the internal configuration of a reflection angle controller 31;

FIG. 7 is a view roughly explaining an operation of a PMW generator 33;

FIG. 8 is a view explaining an example of a modification of FIG. 7;

FIG. 10 is a view schematically showing the configuration of a projection apparatus 10a for simultaneously driving all laser sources;

FIG. 11 is a view explaining a recording area of a hologram recording medium 55a; and FIG. 12 is a view showing an example of the internal configuration of a spatial light modulator 30a.

DETAILED DESCRIPTION OF THE INVENTION

Hereinafter, embodiments of the present invention will be explained with reference to the drawings. In the accompanying drawings of the present description, in order to simplify the drawings and make understanding easy, the scale, the ratio of height to width, etc., are appropriately modified or enlarged.

A projection apparatus and a projection-type image display apparatus according to an embodiment have a configuration for effectively making speckles inconspicuous, as a basic configuration. Moreover, a projection apparatus and a projection-type image display apparatus according to an embodiment have a configuration capable of stably achieving high quality and being safely used by designing the optical path of coherent light beams by focusing on the characteristics of the coherent light beams, that is, excellent straightness and high energy density, in addition to the basic configuration for effectively making speckles inconspicuous.

In the following description, by referring to a projection-type image display apparatus including an illumination device and a projection apparatus exemplified in FIGS. 1 to 8, a configuration for making speckles inconspicuous, advantageous effects exhibited based on the configuration, and a modification of the configuration will be explained as a basic embodiment. Subsequently, a configuration that can be added to the basic embodiment, capable of stably achieving high quality and being safely used, advantageous effects exhibited based on the configuration, and a modification of the configuration will be explained as an additional embodiment.

<Basic Embodiment>

[Configuration of Basic Embodiment]

Firstly, a configuration of a projection-type image display apparatus including an illumination device and a projection apparatus for projecting coherent light beams and capable of making speckles inconspicuous will be explained referring mainly to FIGS. 1 to 8.

Figure 1:
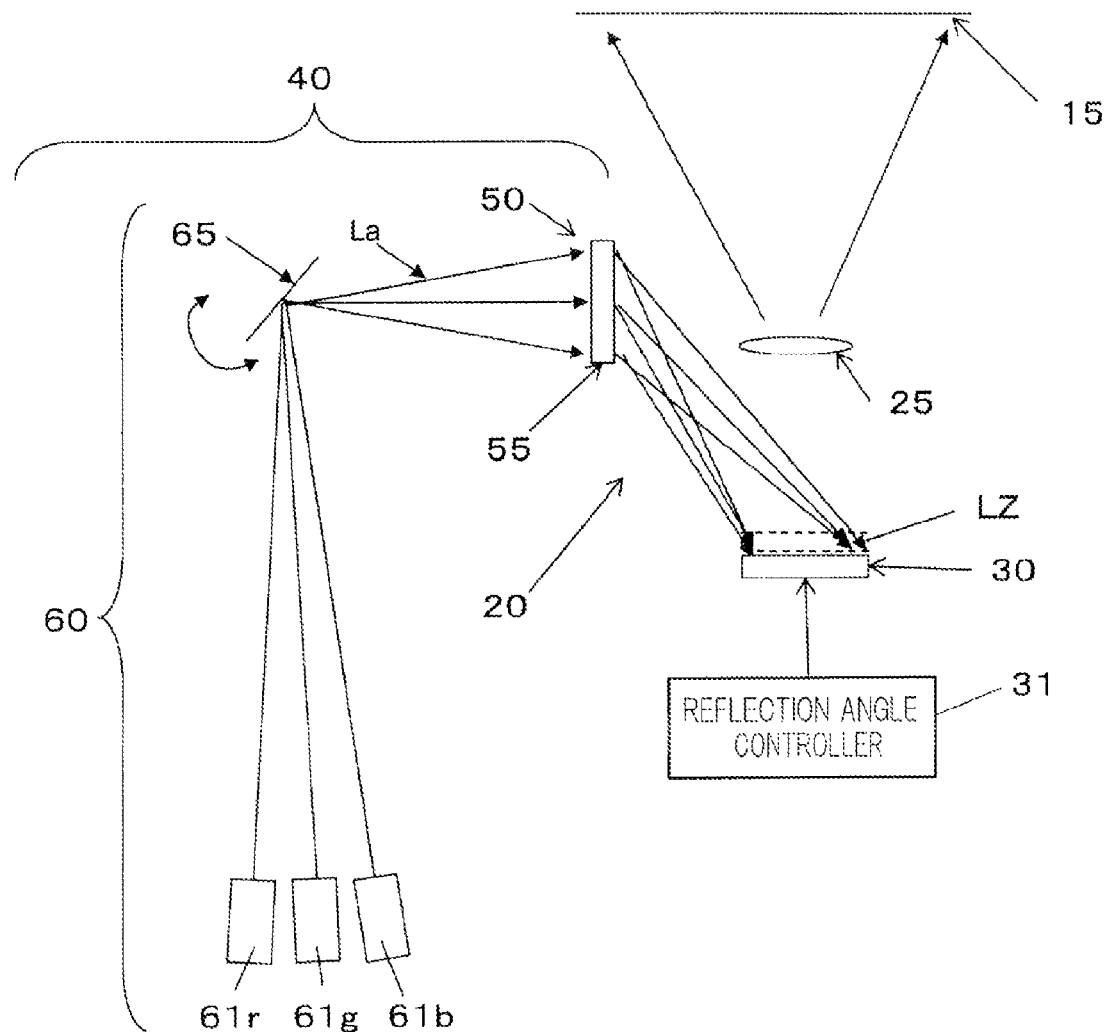
FIG. 1 is a view schematically showing an example of the configuration of a projection-type image display apparatus.

A projection-type image display apparatus 10 shown in FIG. 1 is provided with a screen 15 and a projection apparatus 20 for projecting an image light generated by coherent light beams. The projection apparatus 20 is provided with an illumination device 40 for illuminating an illumination zone LZ located on a virtual plane with coherent light beams, a spatial light modulator 30 that is provided on the location overlapping with the illumination zone LZ and is illuminated with coherent light beams by the illumination device 40, and a projection optical system 25 for projecting coherent light beams from the spatial light modulator 30 onto the screen 15.

In this embodiment, it is presupposed that a MEMS (Micro Electro Mechanical Systems) device such as a DMD is used as the spatial light modulator 30. In the apparatus disclosed in Japanese Patent Laid-Open No. H6 (1994)-208089, a DMD is used as the spatial light modulator. In this case, a modulated image is generated by reflected light beams at the spatial light modulator 30 so that a plane on the spatial light modulator 30 illuminated with coherent light beams from the illumination device 40 and an emitting plane for light beams of an image, i.e. reflected light beams, of a modulated image generated by the spatial light modulator 30 become the same plane.

Hereinbelow, an example using a DMD as the spatial light modulator 30 will be explained. The DMD has a micromirror for each pixel. The reflection angle of each micromirror is switchable.

In more specifically, each micromirror is switchable about whether to make illumination light beams from the illumination device 40 incident on the projection optical system 25 for each frame period that is a unit time for the DMD to create a modulated image. Such an adjustment to the reflection angle of a micromirror is performed by the reflection angle controller 31, the details of which will be described later.

Moreover, it is preferable that the incidence plane of each micromirror of the DMD has the same shape and size as the illumination zone LZ that is illuminated with coherent light beams by the illumination device 40. The reason is that coherent light beams from the illumination device 40 can be used for displaying an image on the screen 15 at high utilization efficiency.

The screen 15 may be a rear-projection-type screen or a front-projection-type screen. In the case where the screen 15 is a front-projection-type screen, an observer observes an image created by coherent light beams reflected on the screen 15 at the same side as the projection apparatus 20 with respect to the screen 15. On the other hand, in the case where the screen 15 is a rear-projection-type screen, an observer observes an image created by coherent light beams that have passed through the screen 15 at the opposite side to the projection apparatus 20 with respect to the screen 15.

Coherent light beams projected onto the screen 15 are diffused and recognized by an observer as an image. In this case, the coherent light beams projected onto the screen interfere with one another due to the diffusion, thus generating speckles. However, in the projection-type image display apparatus 10 which is described here, the illumination device 40 which will be described later has a configuration in which the illumination zone LZ overlapped with the spatial light modulator 25 is illuminated with coherent light beams that exhibit angular variation with time. In more specifically, the illumination device 40 which will be described later has a feature in that, although the entire region of the illumination zone LZ is illuminated with diffused light of coherent light beams, the incident angle of diffused light on the illumination zone LZ varies with time. This results in that a diffusion pattern of coherent light beams on the screen 15 also varies with time, so that speckles caused by the diffusion of the coherent light beams become inconspicuous as they are superimposed one another with time. Hereinafter, the illumination device 40 described above will be explained more in detail.

The illumination device 40 according to the present embodiment is provided with an optical device 50 that directs a propagation direction of coherent light beams to the illumination zone LZ and an irradiation unit 60 that irradiates the optical device 50 with coherent light beams. The optical device 50 includes a hologram recording medium 55 that can reproduce an image of a scattering plate not shown.

The hologram recording medium 55 can receive coherent light beams emitted from the irradiation unit 60 as reproduction illumination light beams La and diffract the coherent light beams at high efficiency. Above all, the hologram recording medium 55 is configured to be capable of reproducing an image of a scattering plate by diffracting coherent light beams incident on its respective positions, in other words, respective micro zones which should be called respective points.

The irradiation unit 60 is configured so that the optical device 50 uses coherent light beams emitted to the hologram recording medium 55 to scan the hologram recording medium 55. Therefore, a zone on the hologram recording medium 55 illuminated with coherent light beams by the irradiation unit 60 at a moment is a portion of the surface of the hologram recording medium 55, i.e. in the example shown, a micro zone which should be called a point.

Coherent light beams emitted from the irradiation unit 60 to scan the hologram recording medium 55 are incident on respective positions, i.e. respective points or respective zones on the hologram recording medium 55 at an incident angle that satisfies diffraction requirements of the hologram recording medium 55. Coherent light beams incident on respective positions of the hologram recording medium 55 from the irradiation unit 60 are diffracted by the hologram recording medium 55 to illuminate the zones that are overlapped with one another at least partially. Above all in the embodiment described here, coherent light beams incident on respective positions of the hologram recording medium 55 from the irradiation unit 60 are diffracted by the hologram recording medium 55 to illuminate the same illumination zone LZ. In more detail, as shown in FIG. 1, the coherent light beams incident on respective positions of the hologram recording medium 55 from the irradiation unit 60 reproduce an image of a scattering plate in a manner that the image is superimposed on the illumination zone LZ. Namely, each coherent light beam incident on each position of the hologram recording medium 55 from the irradiation unit 60 is diffused, i.e. spread by the optical device 50 to be incident on the illumination zone LZ.

As for the hologram recording medium 55 that enables the diffraction of coherent light beams described above, in the example shown, a transmission-type volume hologram using photopolymer is used. FIG. 2 is a view explaining a state in which an image of a scattering plate 6 is generated on the hologram recording medium 55 as interference fringes. Here, the scattering plate 6 is a reference member and any form and shape of the reference member is available.

As shown in FIG. 2, the hologram recording medium 55 is produced using scattered light beams from an actual scattering plate 6 as object beams Lo. FIG. 2 shows a state in which a hologram photosensitive material 58 that exhibits photosensitivity to become the hologram recording medium 55 is exposed by reference beams Lr and object beams Lo, both being coherent lights that exhibit coherence to each other.

As for the reference beams Lr, for example, laser beams from a laser source that oscillates laser beams in a specific wavelength range are used. The reference beams Lr pass through a condenser element 7 made of a lens and are incident on the hologram photosensitive material 58. In the example shown in FIG. 2, laser beams to become the reference beams Lr are incident on the condenser element 7 as a parallel light flux that is parallel with the optical axis of the condenser element 7. By passing through the condenser element 7, the reference beams Lr are reshaped, i.e. converted, from a parallel light flux into a convergent light flux and incident on the hologram photosensitive material 58. On this occasion, a focal point FP of the convergent light flux Lr is located at a position beyond the hologram photosensitive material 58. In other words, the hologram photosensitive material 58 is located between the condenser element 7 and the focal point FP of the convergent light flux Lr collected by the condenser element 7.

Next, the object beams Lo are incident on the hologram photosensitive material 58 as scattered light from the scattering plate 6 made of opal glass, for example. In the example shown in FIG. 2, the hologram recording medium 55 to be produced is a transmission type and the object beams Lo are incident on the hologram photosensitive material 58 on the same side as the reference beams Lr. It is a precondition that the object beams Lo are coherent with the reference beams Lr. Therefore, for example, it is possible to separate laser beams oscillated by the same single laser source and use one of the separated ones as the reference beams Lr and the other as the object beams Lo.

In the example shown in FIG. 2, a parallel light flux that is parallel with the direction of normal to the plate surface of the scattering plate 6 is incident on the scattering plate 6 and scattered, and then the scatted beams that have passed through the scattering plate 6 are incident on the hologram photosensitive material 58 as the object beams Lo. According to this method, when an isotropic scattering plate available at low cost is used as the scattering plate 6, the object beams Lo can be easily incident on the hologram photosensitive material 58 at roughly constant intensity distribution. Moreover, according to this method, although depending on the degree of scattering by the scattering plate 6, the reference beams Lr can be easily incident on respective positions of the hologram photosensitive material 58 at roughly constant intensity from the entire region of a light-emitting surface 6a of the scattering plate 6. In such a case, it is achievable that light beams incident on respective positions of the obtained hologram recording medium 55 reproduce images 5 of the scattering plate at similar brightness and reproduced images 5 of the scattering plate 6 are observed at roughly constant brightness.

As described above, when the hologram photosensitive material 58 is exposed by the reference beams Lr and object beams Lo, interference fringes caused by the interference between the reference beams Lr and object beams Lo are generated and interference fringes of these light beams are recorded in the hologram photosensitive material 58 as some form of pattern, i.e. an refractive index modulation pattern, as one example in a volume hologram. Thereafter, an appropriate post treatment corresponding to the type of the hologram photosensitive material 58 is applied, thereby obtaining the hologram recording medium 55.

FIG. 3 is a view explaining a state in which an image of a scattering plate is reproduced using interference fringes formed in the hologram recording medium 55 obtained through an exposure process of FIG. 2. As shown in FIG. 3, the hologram recording medium 55 produced with the hologram photosensitive material 58 of FIG. 2 meets its Bragg condition by means of light beams that have the same wavelength as the laser beams used in the exposure process and travel in a reverse direction of the reference beams Lr along an optical path of the reference beams Lr. Namely, as shown in FIG. 3, a diverging light flux that diverges from a reference point SP located with respect to the hologram recording medium 55 so as to have the same positional relationship as the relative position of the focal point FP in FIG. 2 with respect to the hologram photosensitive material 58 and that has the same wavelength as the reference beams Lr in the exposure process is refracted by the hologram recording medium 55 as the reproduction illumination light beams La, thereby creating the image 5 of the scattering plate 6 at a specific location with respect to the hologram recording medium 50 so as to have the same positional relationship as the relative position of the scattering plate 6 in FIG. 2 with respect to the hologram photosensitive material 58 in the exposure process.

In this occasion, reproduction beams Lb. i.e. beams obtained by diffracting the reproduction illumination light beams La by the hologram recording medium 55, for creating a reproduced image 5 of the scattering plate 6 reproduce respective points of the reproduced image 5 of the scattering plate 6 as beams travelling in the reverse direction of the optical path of the object beams Lo traveled towards the hologram photosensitive material 58 from the scattering plate 6 in the exposure process. Moreover, as described above and as shown in FIG. 2, scattered beams Lo emitted from respective points of the light-emitting surface 6a of the scattering plate 6 in the exposure process are diffused, i.e. spread, to be incident on roughly entire region of the hologram photosensitive material 58. Namely, on respective points of the hologram photosensitive material 58, the object beams Lo from the entire region of the light-emitting surface 6a on the scattering plate 6 are incident. As a result, information of the entire light-emitting surface 6a is recorded at respective points of the hologram recording medium 55.

It is therefore possible that beams shown in FIG. 3 which correspond to a diverging light flux from the reference point SP and function as the reproduction illumination light beams La are incident on respective points of the hologram recording medium 55 to reproduce the images 5 of the scattering plate 5 having the same contour as one another at the same location, i.e. the illumination zone LZ, respectively.

The light beams incident on the hologram recording medium 55 are diffracted in the direction of the illumination zone LZ, hence useless scattered light can be effectively restricted. Therefore, all of the reproduction illumination beams La incident on the hologram recording medium 55 can be effectively used for creating the image of the scattering plate 6.

Next, the configuration of the irradiation unit 60 that emits coherent light beams to the optical device 50 made of the hologram recording medium 55 described above will be explained. In the example shown in FIG. 1, the irradiation unit 60 is provided with laser sources 61r, 61g and 61b of three colors, each generating coherent light beams and a scanning device 65 that changes the propagation direction of coherent light beams from these laser sources 61.

The laser sources 61r, 61g and 61b emit coherent light beams of wavelength ranges different from one another. In detail, the laser sources 61r, 61g and 61b emit light in red, green and blue, respectively. In addition to these three types of laser sources, another laser source that has a different wavelength range, that is, that emits light in another color such as yellow may be provided. Moreover, at least one of the laser sources 61r, 61g and 61b may be replaced with a laser source that emits light in another color.

In the projection apparatus 10 of FIG. 1, the laser sources 61r, 61g and 61b do not emit light beams simultaneously but emit light beams in a sequential order. In other words, the laser sources are driven by time-division driving. Thus, at a particular time, only any one of the laser sources emits light beams so that the illumination zone LZ is illuminated with a color in accordance with an emission wavelength of the laser source that is emitting light beams.

Regardless of which of the laser sources 61r, 61g and 61b is emitting light beams, the scanning device 65 varies the reflection angle of coherent light beams from the laser source so that the coherent light beams scan the entire or a partial region of the recording area in the hologram recording medium 55.

Accordingly, the hologram recording medium 55 is illuminated with red, green or blue for each unit time, for example. The unit time is a period of time by which emission is switched among the laser sources 61r, 61g and 61b.

Although depending on the characteristics of the laser sources 61r, 61g and 61b, a color much closer to white may be reproduced by providing another laser source, for example, a laser source that emits light in yellow, other than red, green and blue. Therefore, there is no particular limitation on the type of laser source provided in the irradiation unit 60. For example, when laser sources of four colors are provided, the laser sources may be driven by time-division driving.

The scanning device 65 changes the propagation direction of a coherent light beam with time to direct the coherent light beam in different directions so that the coherent light beam does not travel in the same direction. This results in that the coherent light beam, the propagation direction of which is changed by the scanning device 65, scans the incidence surface of the hologram recording medium 55 of the optical device 50. In the example of FIG. 1, three types of coherent light beams are incident on the scanning device 65 from the laser sources 61*r* 61*g* and 61*b* at different timings. Therefore, the scanning device 65 changes the reflection angle of these coherent light beams with time to scan the entire region of the recording area in the hologram recording medium 55.

Figure 4:
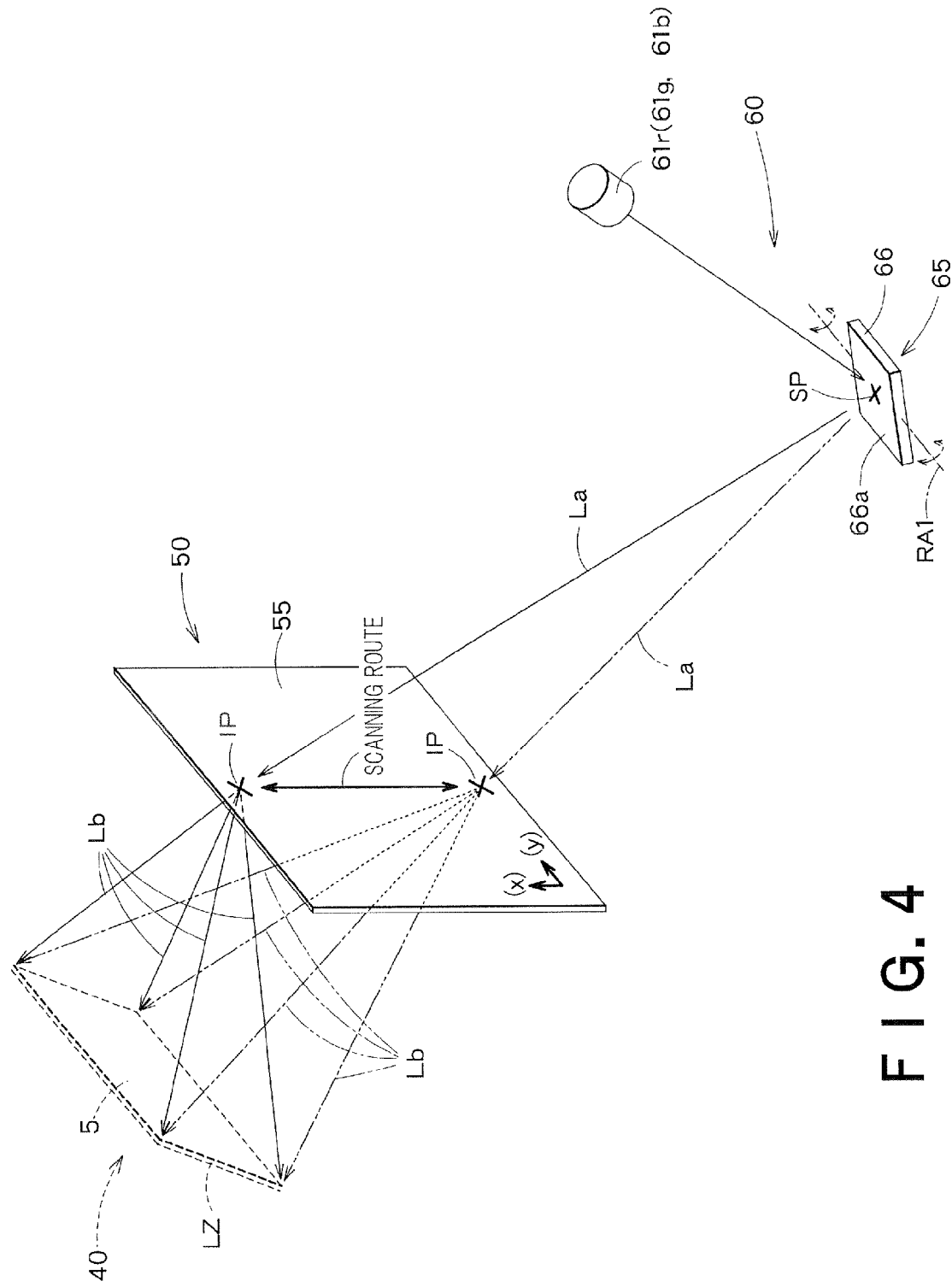
FIG. 4 is a view explaining a scanning route of a scanning device 65.

In the example of FIG. 4, the scanning device 65 includes a reflection device 66 having a reflection surface 66*a* rotatable about one axis line RA1. FIG. 4 is a view explaining a scanning route of the scanning device 65. As understood from FIG. 4, the reflection device 66 has a mirror device that has a mirror as the reflection surface 66*a* (hereinafter mirror 66*a*) rotatable about one axis line RA1. The reflection device 66 is configured to change the orientation of the mirror 66*a* to change the propagation direction of the coherent light beams from the laser sources 61*r*, 61*g* and 61*b*. In this occasion, as shown in FIG. 4, the mirror device 66 is provided so as to receive the coherent light beams from the laser sources 61 roughly at the reference point SP.

A coherent light beam that has undergone final adjustments of the propagation direction by the mirror device 66, can be incident on the hologram recording medium 55 of the optical device 50 as a reproduction illumination light beam La that can become one beam of a diverging light flux from the reference point SP in FIG. 3. As a result, coherent light beams from the irradiation unit 60 scan the hologram recording medium 55 and coherent light beams incident on respective positions of the hologram recording medium 55 reproduce images 5 of the scattering plate 6 having the same contour on the same location, i.e. the illumination zone LZ.

As shown in FIG. 4, the mirror device 66 shown in FIG. 1 is configured to rotate the mirror 66*a* about one axis line RA1. In the example shown in FIG. 4, the rotation axis line RA1 of the mirror 66*a* extends in parallel with the y-axis of the x-y axis system, that is, the x-y axis system having the x-y plane in parallel with the surface of the hologram recording medium 55, defined on the surface of the hologram recording medium 55. Then, the mirror 66*a* rotates about the axis line RA1 that is in parallel with the y-axis of the x-y axis system defined on the surface of the hologram recording medium 55. Therefore, an incidence point IP of a coherent light beam from the irradiation unit 60 on the optical device 50 moves in a reciprocating motion in the direction parallel with the x-axis of the x-y axis system defined on the surface of the hologram recording medium 55. Namely, in the example shown in FIG. 4, the irradiation unit 60 emits a coherent light beam to the optical device 50 to scan the hologram recording medium 55 along a straight route.

The scanning device 65 having the mirror device 66 and other components is, as described above, a member rotatable about at least the axis line RA1 and configured with a MEMS, for example. The scanning device 65 periodically moves in rotational motion, however, there is no particular limitation on its rotational frequency.

As a practical problem, there is a case where the hologram photosensitive material 58 shrinks when the hologram recording medium 55 is produced. In such a case, it is preferable to adjust the recording angles of coherent light beams to be entered to the optical device 50 from the irradiation unit 60 under consideration of the shrinkage of the hologram photosensitive material 58. The wavelengths of coherent light beams generated by the laser sources 61*r*, 61*g* and 61*b* do not need to be precisely the same as the wavelength of the light beam used in the exposure process, recording process, of FIG. 2 but may be roughly the same.

In a similar reason, even if the propagation direction of a light beam to be incident on the hologram recording medium 55 of the optical device 50 does not take precisely the same route as one beam included in a diverging light flux from the reference point SP, an image 5 can be reproduced in the illumination zone LZ. Actually, in the examples shown in FIG. 4, the mirror, i.e. reflection plane 66*a* of the mirror device 66 composing of the scanning device 65 is inevitably displaced from its rotational axis line RA1. Therefore, in the case where the mirror 66*a* is rotated about the rotational axis line RA1 that does not pass through the reference point SP, it happens that a light beam to be incident on the hologram recording medium 55 is not one of the beams corresponding to a diverging light flux from the reference point SP. However, practically, an image 5 can be substantially reproduced in a manner that the image 5 is superimposed on the illumination zone LZ by means of coherent lights from the irradiation unit 60 having the shown configuration.

[Effects of Basic Embodiment]

Next, the functions of the illumination device 40, the projection apparatus 20 and the projection-type image display apparatus 10 having the configurations described above will be explained.

Firstly, the irradiation unit 60 emits coherent light beams to the optical device 50 so as to scan the hologram recording medium 55 of the optical device 50. Specifically, the laser sources 61*r*, 61*g* and 61*b* generate coherent light beams having a specific wavelength that travel along a unidirection. These coherent light beams are emitted to the same reference point on the scanning device 65 to change their respective propagation directions. More specifically, the coherent light beams travel towards the hologram recording medium 55 at reflection angles in accordance with incident angles from the laser sources 61*r*, 61*g* and 61*b*, respectively.

On respective positions in each recording area on the hologram recording medium 55, the scanning device 65 makes the corresponding coherent light beams of specific wavelength incident at an incidence angle that meets the Bragg condition on the respective positions. As a result, the coherent light beams incident on the specific positions illuminate the entire region of the illumination zone LZ in a superimposed manner by diffraction caused by interference fringes recorded in the hologram recording medium 55. Namely, the coherent light beams incident on specific positions of the hologram recording medium 55 are diffused, i.e. spread, by the optical device 50 to be incident on the entire region of the illumination zone LZ. As described above, the laser sources 61*r*, 61*g* and 61*b* emit light beams in different colors and are driven by time-division driving. Therefore, an image 5 of the scattering plate 6 is reproduced in the illumination zone LZ in each color.

The position of incidence of coherent light beams from the scanning device 65 is shifted with time in each recording area by the operation of the scanning device 65.

As shown in FIG. 1, in the projection apparatus 20, the spatial light modulator 30 is provided at the location overlapping with the illumination zone LZ. Therefore, the spatial light modulator 30 is illuminated by the illumination device 40 in the plane direction so that so that coherent light beams are selectively passed through per pixel to create an image. This image is projected onto the screen 15 by the projection optical system 25.

The coherent light beams projected onto the screen 15 are diffused and recognized by an observer as an image. Nevertheless, the coherent light beams projected onto the screen 15 interfere with one another due to the diffusion to generate speckles.

However, according to the illumination device 40 in the basic embodiment described here, speckles become inconspicuous very effectively, as explained below.

According to Speckle Phenomena in Optics, Joseph W. Goodman, Roberts & Co., 2006 cited above, it is effective to integrate parameters such as polarization, phase, angle and time to increase modes.

The modes here are speckle patterns with no correlation one another. For example, in the case where coherent light beams are projected onto the same screen in different directions from a plurality of laser sources, modes exist in the same number as the laser sources. Moreover, in the case where coherent light beams are projected onto a screen in different directions intermittently from the same laser source, modes exist by the number of changes in the incidence direction of the coherent light beams during the time that is not covered by the resolution of human eyes. It is assumed that, in the case where there are these modes, the interference patterns of light are superimposed and averaged with no correlation, and as a result, speckles observed by eyes of an observer are inconspicuous.

In the irradiation unit 60 described above, coherent light beams are emitted to the optical device 50 to scan the hologram recording medium 55. Although coherent light beams incident on respective locations of the hologram recording medium 55 illuminate the entire region of the same illumination zone LZ, the illuminating direction of the coherent light beams to illuminate the illumination zone LZ are different from one another. And, since the position on the hologram recording medium 55 on which a coherent light beam is incident changes with time, the incidence direction of the coherent light beam on the illumination zone LZ also changes with time.

When considering the illumination zone LZ as the reference, a coherent light beam is always incident on each location of the illumination zone LZ, however, its incidence direction always changes. As a result, a light beam that makes up each pixel of an image created by light passing through the spatial light modulator 30 is projected onto a specific position of the screen 15.

A coherent light beam continuously scans the hologram recording medium 55. Following to this, the incidence direction of a coherent light beam to the illumination zone LZ from the irradiation unit 60 also continuously changes and the incidence direction of a coherent light beam to the screen 15 from the projection apparatus 20 also continuously changes. When the incidence direction of a coherent light beam to the screen 15 from the projection apparatus 20 changes slightly, for example, an angle less than 1°, a speckle pattern generated on the screen 15 changes greatly, resulting in superimposition of speckle patterns with no correlation. In addition, the frequency of a scanning device 65 such as a MEMS mirror and a polygonal mirror actually on the market is usually several hundred Hz or higher and a scanning device 65 of frequency reaching several ten thousands Hz is not rare.

Accordingly, according to the basic embodiment described above, the incidence direction of a coherent light beam changes with time on each location on the screen 15 that is displaying an image and this change occurs at a speed that is not covered by the resolution of human eyes. As a result, scattering patterns of coherent light beams with no correlation are superimposed and observed by human eyes. Therefore, speckles generated corresponding to respective scattering patterns are superimposed and observed by an observer. Accordingly, speckles become inconspicuous effectively to an observer who observes an image displayed on the screen 15 that is displaying an image.

Conventionally, speckles observed by humans are not only speckles at the screen side caused by the scattering of coherent light beams on the screen 15 but also speckles at the projection apparatus side that could occur due to the scattering of coherent light beams before projection onto the screen. The speckle pattern generated at the projection apparatus side is also recognizable to an observer by being projected onto the screen 15 via the spatial light modulator 30. However, according to the basic embodiment described above, coherent light beams continuously scan the hologram recording medium 55 and each of the coherent light beams incident on respective locations on the hologram recording medium 55 illuminates the entire region of the illumination zone LZ on which the spatial light modulator 30 is provided. Namely, the hologram recording medium 55 creates new wavefronts different from the prior wavefronts that have formed speckle patterns, thereby illuminating the screen 15 in a complex manner and uniformly via the illumination zone LZ and further the spatial light modulator 30. By the creation of new wavefronts at the hologram recording medium 55, speckle patterns generated at the projection apparatus side become invisible.

In this embodiment, in synchronism with the time-division driving of the laser sources 61*r*, 61*g* and 61*b*, the reflection angles of the micromirrors of the DMD as the spatial light modulator 30 are switching-controlled. The micromirrors are provided for RGB colors, respectively, for each pixel. While the laser source 61*r* is emitting light beams, the reflection angle of the micromirror for red is switching-controlled for each pixel. While the laser source 61*g* is emitting light beams, the reflection angle of the micromirror for green is switching-controlled for each pixel. While the laser source 61*b* is emitting light beams, the reflection angle of the micromirror for blue is switching-controlled for each pixel.

The reflection angle controller 31 controls the reflection angle of each micromirror of the DMD in synchronism with the emission state of the laser sources 61*r*, 61*g* and 61*b*.

FIG. 6 is a block diagram showing an example of the internal configuration of the reflection angle controller 31. As shown, the reflection angle controller 31 has an emission color decision unit 32, a PWM generator 33, and a random number generator 34. The emission color decision unit 32 receives emission information of the laser sources 61*r*, 61*g* and 61*b* decides that the reflection angle of which color's micromirror should be switched. The PWM generator 33 generates a pulse-width modulation signal (hereinafter, a PWM signal) for instructing a timing at which light reflected by a micromirror is incident on the projection optical system 25. The random number generator 34 generates random numbers or pseudorandom numbers for setting the time at which light reflected by a micromirror starts to be guided to the projection optical system 25, randomly, that is, irregularly or unevenly.

The emission color decision unit 32 may decide an emission color by receiving signals from the laser sources 61*r*, 61*g* and 61*b*. Moreover, the emission color decision unit 32 may have a function of controlling the emission timing of the laser sources 61r, 61g and 61b. In this case, the emission color decision unit 32 transmits an emission control signal to each laser source.

FIG. 7 is a view schematically explaining an operation of the PWM generator 33. As shown, the PWM generator 33 has, for example, six registers 35 for generating each frame. Here, a frame indicates one modulated image created by the DMD at a certain timing. Six registers 35 are used for creating one modulated image. A unit time for creating a modulated image that makes up each frame is referred to as a frame period. The registers 35 are used for generating pulse signals having different pulse widths. The numbers 1 to 6 are assigned to the registers 35 for representing a pulse width of a pulse signal according to the value of each register. The register 35 with the number "6" can generate a pulse signal of a pulse width six times wider than the register 35 with the number "1". Accordingly, the registers 35 can be used for generating pulse signals having six kinds of pulse widths of one time to six times wider.

In an example of FIG. 7(a), the alignment order of the six registers 35 is the same for any frame. The number "0" or "1" is stored in each register 35. When a register 35 has "0" stored therein, the register 35 is not used for generating a pulse signal. When a register 35 has "1" stored therein, the register 35 generates a pulse signal of a pulse width in accordance with the number. For example, when the registers 35 aligned in the alignment order as shown in FIG. 7(a) have "100101" stored therein from left to right as gradient data, the PWM generator 33 generates a PWM signal having a pulse width of "1"+"00"+"000"+"1111"+"00000"+"111111", as shown in FIG. 7(b).

This PWM signal is supplied to the corresponding micromirror of the DMD. Each micromirror is adjusted to vary the reflection angle in the following manner. During a period in which the PWM signal is "1", the micromirror allows coherent light beams from the hologram recording medium 55 to be incident on the projection optical system 25. However, during a period in which the PWM signal is "0", the micromirror does not allow coherent light beams from the hologram recording medium 55 to be incident on the projection optical system 25. In FIG. 7(b), white circles indicate that coherent light beams from the hologram recording medium 55 are allowed to be incident on the projection optical system 25, and black circles indicate that coherent light beams from the hologram recording medium 55 are not allowed to be incident on the projection optical system 25. As described, the reflection angle of each micromirror of the DMD is switched in two ways according to the logic of the PWM signal. When the PWM signal is "1", coherent light beams from the hologram recording medium 55 are incident on the projection optical system 25. However, when the PWM signal is "0", coherent light beams from the hologram recording medium 55 are not incident on the projection optical system 25.

The present embodiment has a feature in that the six registers 35 having different pulse widths can be aligned in any order according to random numbers generated by the random number generator 34. Namely, in the present embodiment, the registers 35 are aligned, not in a fixed order for any frame as shown in FIG. 7(a), but in a random order for each frame as shown in FIG. 8(a). For example, for a 1/N frame, registers 35 are aligned in order of ×1 to ×6 in pulse width, however, for a 2/N frame, registers 35 are aligned in order of ×5, ×6, ×1, ×2, ×3 and ×4 in pulse width. Moreover, for an N/N frame, registers 35 are aligned in order of ×3, ×4, ×5, ×6, ×1 and ×2 in pulse width.

As described above, in the present embodiment, the registers 35 can be aligned in any order for each frame. For example, it is supposed that, for the 2/N frame, gradient data "100101" is stored in these six registers 35 from left to right in the same as described above. In this case, as shown FIG. 8(b), the PWM generator 33 generates a PWM signal having a pulse width of "11111"+"000000"+"0"+"11"+"000"+"1111" for the 2/N frame. This PWM signal is completely different from the PWM signal shown in FIG. 7(b), giving completely different switching timings to the micromirrors of the DMD.

By randomly aligning the registers 35, the PWM generator 33 generates a random PWM signal even if the same gradient data is input to the registers 35.

A random PWM signal means that a timing of adjusting the reflection angle of each micromirror of the DMD becomes random. Therefore, for each frame period, light of modulated image is incident on the projection optical system 25 from the DMD at random timing.

In the present embodiment, the scanning device 65 scans the hologram recording medium 55 with coherent light beams so as to make speckles inconspicuous. If the luminance of light of modulated image created by the DMD is high, speckles may be inconspicuous without the above-described random control of the reflection angle of each micromirror by the PWM generator 33.

This is because the region on which a hologram is scanned for one frame period can be enlarged. However, if the gradient level of light of modulated image is low, the irradiation period of light irradiated to the projection optical system 25 during one frame period is short. Moreover, light may always be irradiated to the same region of a hologram if the frame rate of the DMD and the hologram scanning frequency are in synchronism with each other. Thus, scanning by the scanning device 65 only may allow speckles to be conspicuous. Therefore, the random control described above is effective especially when the gradient level of light of modulated image is low.

The random-number generator described above is created using generating polynominal, with no particular limitation to the random-number generation method. The random-number generator may not always necessary to generate highly-random random numbers but may generate numbers having randomness at the degree at which speckles become inconspicuous. The number of registers 35 in the PWM generator 33 may also not always necessary be six as described above. Moreover, the pulse width of each register 35 can be changed arbitrarily.

Figure 9:
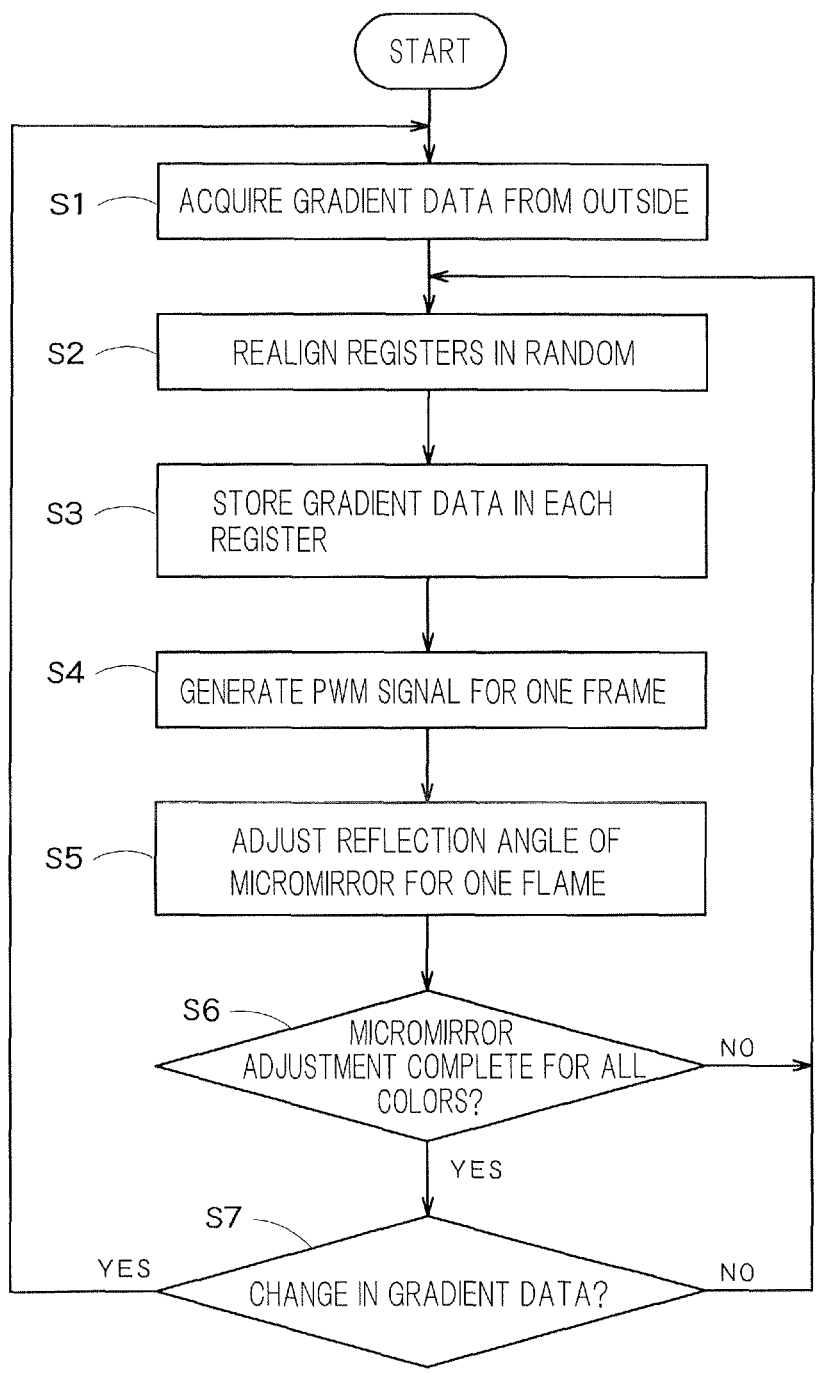
FIG. 9 is a flowchart showing an example of an operation procedure of the reflection angle controller 31.

FIG. 9 is a flowchart showing an example of an operation procedure of the reflection angle controller 31. Firstly, the reflection angle controller 31 acquires externally-applied gradient data for the DMD as the spatial light modulator 30 (step S1). The gradient data indicates a level among 256 gradient levels for each color of RGB. For a single color with no color information required, luminance data is acquired, instead of gradient data.

Next, the reflection angle controller 31 acquires random numbers generated by the random number generator 34 and randomly realigns, for example, six registers using the random numbers (step S2). Subsequently, the reflection angle controller 31 stores the gradient data acquired in step S1 in each of the realigned registers (step S3).

In this case, the reflection angle controller 31 stores in each register the gradient data corresponding to the emission color decided by the emission color decision unit 32.

Next, the reflection angle controller 31 generates a PWM signal for one frame based on the data stored in the registers and pulse width information assigned to each register (step S4). Subsequently, the reflection angle controller 31 adjusts the reflection angle of each micromirror based on the generated PWM signal (step S5). Accordingly, a modulated image for one frame of the DMD is created and incident on the projection optical system 25.

Next, the reflection angle controller 31 determines whether it has performed the same processing for all colors of RGB (step S6), and repeats step S2 and the succeeding steps if there is a color for which the processing has not been performed yet.

When it is determined that the processing has been performed for all colors in step S6, the reflection angle controller 31 determines whether there is a change in the gradient data (step S7). If there is no change in the gradient data, the reflection angle controller 31 performs step S2 and the succeeding steps for each color.

When it is determined that there is a change in the gradient data in step S7, the reflection angle controller 31 returns to step S1 to acquire new gradient data and, thereafter, performs step S2 and the succeeding steps.

In the above explanation of the reflection angle controller 31, an example in which the DMD has a micromirror for each color of each pixel has been described. However, in the case of single color display, one micromirror may be provided for each pixel and the adjustment timing of the reflection angle of each micromirror may be controlled to become random for each frame period based on external luminance data. In this case, the emission color decision unit 32 of FIG. 6 is not necessary.

In the projection apparatus 10 of FIG. 1, it is a precondition that the 3-color laser sources 61r, 61g and 61b are driven by time-division driving. However, it is also possible to realize a projection apparatus in which the laser sources 61r, 61g and 61b emit light simultaneously to project a DMD's modulated image onto the screen 15. FIG. 10 is a view schematically showing the configuration of a projection apparatus 10a in this case. In FIG. 10, the same reference signs are given to the common elements with FIG. 1. The different points will be mainly explained.

The differences between the projection apparatus 10a of FIG. 10 and the projection apparatus 10 of FIG. 1 are data stored in a hologram recording medium 55a, the internal configuration of a spatial light modulator 30a, and the operation of a reflection angle controller 31a. Moreover, it is a precondition for the projection apparatus 10a that the laser sources 61r, 61g and 61b emit light simultaneously, not by time-division driving.

The hologram recording medium 55a of FIG. 10 is provided with three recording areas 55r, 55g and 55b corresponding to the laser sources 61r, 61g and 61b, respectively, as shown in an enlarged view of FIG. 11. Red-color coherent light beams emitted from the laser sources 61r and reflected by the scanning device 66 are incident on the recording area 55r. Accordingly, an image 5 of the scattering plate 6 of red-color reproduction light beams is created on the entire region of the illumination zone LZ. The scanning device 65 varies the reflection angle of the red-color coherent light beams from the laser sources 61r with time, hence the irradiation point of red-color coherent light beams in the recording area 55r changes accordingly. Nevertheless, the scanning device 65 controls the reflection angle so that red-color coherent light beams from the laser sources 61r are not incident on the positions outside the recording area 55r.

In the similar manner, green-color coherent light beams emitted from the laser sources 61r and reflected by the scanning device 66 are incident on the recording area 55g. Accordingly, an image 5 of the scattering plate 6 of red-color reproduction light beams is created on the entire region of the illumination zone LZ. Moreover, blue-color coherent light beams emitted from the laser sources 61r and reflected by the scanning device 66 are incident on the recording area 55b. Accordingly, an image 5 of the scattering plate 6 of red-color reproduction light beams is created on the entire region of the illumination zone LZ.

After all, the illumination zone LZ is illuminated with three colors of red, green and blue. When the laser sources 61r, 61g and 61b emit coherent light beams simultaneously, the illumination zone LZ is illuminated with white that is a mixture of three colors.

The recording areas 55r, 55g and 55b may not always necessarily be tightly arranged, that is, may be arranged with gaps thereamong. In the case of having gaps, no coherent light beam reflected by the scanning device 65 is incident on the gaps. It is, however, not a problem practically. Moreover, the recording areas 55r, 55g and 55b may not have an equal area. However, if interference fringes are formed on the recording areas 55r, 55g and 55b in a manner that the interference fringes are overlapped with one another, the index modulation rate is lowered for each interference fringe that corresponds to each color. This results in different brightness on the illumination zone LZ compared to the case of single-color interference fringes. Therefore, it is better to arrange the recording areas 55r, 55g and 55b so that they are not overlapped with one another.

In order to provide the recording areas 55r, 55g and 55b in the hologram recording medium 55a, a reference beam Lr and an object beam Lo are emitted to each recording area to generate interference fringes thereon, according to the principle of FIG. 2.

Or, the hologram recording medium 55a may be formed into a stack structure so that a specific color is diffracted in each layer. For example, a layer 55r for red, a layer 55g for green and a layer 55b for blue may be stacked from the top to the bottom of the hologram recording medium 55a, with interference fringes recorded in each layer for coherent light beams of respective colors (respective wavelength ranges) to be interfered with one another.

Although depending on the characteristics of the laser sources 61r, 61g and 61b, a color much closer to white may be reproduced by providing another laser source, for example, a laser source that emits light in yellow, other than red, green and blue. Therefore, there is no particular limitation on the type of laser source provided in the irradiation unit 60. For example, when laser sources of four colors are provided, the hologram recording medium 55a may be divided into four areas that are associated with respective laser sources.

The scanning device 65 changes the propagation direction of a coherent light beam with time to direct the coherent light beam in different directions so that the coherent light beam does not travel in the same direction. This results in that the coherent light beam, the propagation direction of which is changed by the scanning device 65, scans the incidence surface of the hologram recording medium 55a of the optical device 50. In the example of FIG. 10, three types of coherent light beams are incident on the scanning device 65 from the laser sources 61r 61g and 61b. Therefore, the scanning device 65 changes the reflection angle of these coherent light beams with time to scan the incidence surface of each of the recording areas 55r, 55g and 55b of the hologram recording medium 55a.

Next, the internal configuration of a spatial light modulator 30a of the projection apparatus 10a in FIG. 10 will be explained.

FIG. 12 is a view showing an example of the internal configuration of the spatial light modulator 30a. As shown, the spatial light modulator 30a has three DMD (spatial light modulators) 36r, 36g and 36b provided for respective colors, a cross dichroic prism 37, and a total-reflection type splitting prism 38. The incidence surface of the total-reflection type splitting prism 38 is almost overlapped with the illumination zone LZ. Coherent light beams from the hologram recording medium 55a to illuminate the illumination zone LZ are reflected by the total-reflection type splitting prism 38 by total reflection and incident on the cross dichroic prism 37. The cross dichroic prism 37 has two cross dichroic surfaces 39 inside. Coherent light beams incident on the cross dichroic surfaces 39 are split into light beams of three primary colors of R, G and B. The split light beams of respective colors propagate in three directions perpendicular to one another. The DMDs 36r, 36g and 36b previously arranged in the three directions create modulated images for respective colors. Light beams of the modulated images created by the DMDs 36r, 36g and 36b go through the reverse path and are combined with one another on the cross dichroic surfaces 39, and then incident on the projection optical system 25.

The projection apparatus 10a of FIG. 10 has the DMDs 36r, 36g and 36b for respective colors. Thus, it is required for a reflection angle controller 31a to separately control the refection angle of each micromirror of the DMDs 36r, 36g and 36b. The internal configuration of the reflection angle controller 31a corresponds to FIG. 6 from which the emission color decision unit 32 is omitted. The reflection angle controller 31a generates a PWM signal for adjusting the reflection angle of each micromirror for each of the DMDs 36r, 36g and 36b, and transmits the PWM signal to each of the DMDs 36r, 36g and 36b. Based on the corresponding PWM signal, each of the DMDs 36r, 36g and 36b adjusts the reflection angle of each micromirror so that speckles become invisible on the screen 15.

As described above, although the projection apparatus 10a has a disadvantage in that three DMDs 36r, 36g and 36b are necessary, it can enhance the brightness on the screen 15 by simultaneous emission from the laser sources 61r, 61g and 61b.

(Avoidance of Zero-Order Light)

Part of coherent light beams from the irradiation unit 60 is not diffracted by the hologram recording medium 55 but passes through the hologram recording medium 55. This type of light is called zero-order light. When zero-order light is incident on the illumination zone LZ, an abnormal region, i.e. a spotted region, a line region, and a plane region, inevitably appears in which brightness, i.e. intensity, is rapidly increased compared with the surroundings.

When a reflection-type volume hologram recording medium 55, hereinafter, "a reflection-type volume hologram", is used, the illumination zone LZ is not provided in a propagation direction of zero-order light, hence it is relatively easy to avoid zero-order light. However, when a transmission-type volume hologram recording medium 55, hereinafter, "a transmission-type volume hologram" is used, zero-order light can be separated by selecting a recording angle so that incident light beams and emitting light beams do not interfere with each other. Therefore, if it is not possible to separate the optical path of zero-order light and the optical path of first-order light due to the arrangement, it is desirable to raise a diffraction efficiency as much as possible to restrict the influence of zero-order light as much as possible.

(Reflection- and Transmission-Type Hologram Recording Media 55)

Reflection-type holograms have higher wavelength selectivity than transmission-type holograms. In other words, in reflection-type holograms, although interference fringes corresponding to different wavelengths are superimposed one another in layers, a coherent light beam having a desired wavelength can be diffracted by a desired layer only. In addition, reflection-type holograms are excellent in that the influence of zero-order light can be easily removed.

On the other hand, although transmission-type holograms have a wide spectrum range for diffraction and a high acceptable level to the laser source 61, if interference fringes corresponding to different wavelengths are superimposed one another in layers, layers other than a desired layer also diffract coherent light of a desired wavelength. Therefore, in general, it is difficult to configure transmission-type holograms in a layered structure.

(Irradiation Unit 60)

Figure 5:
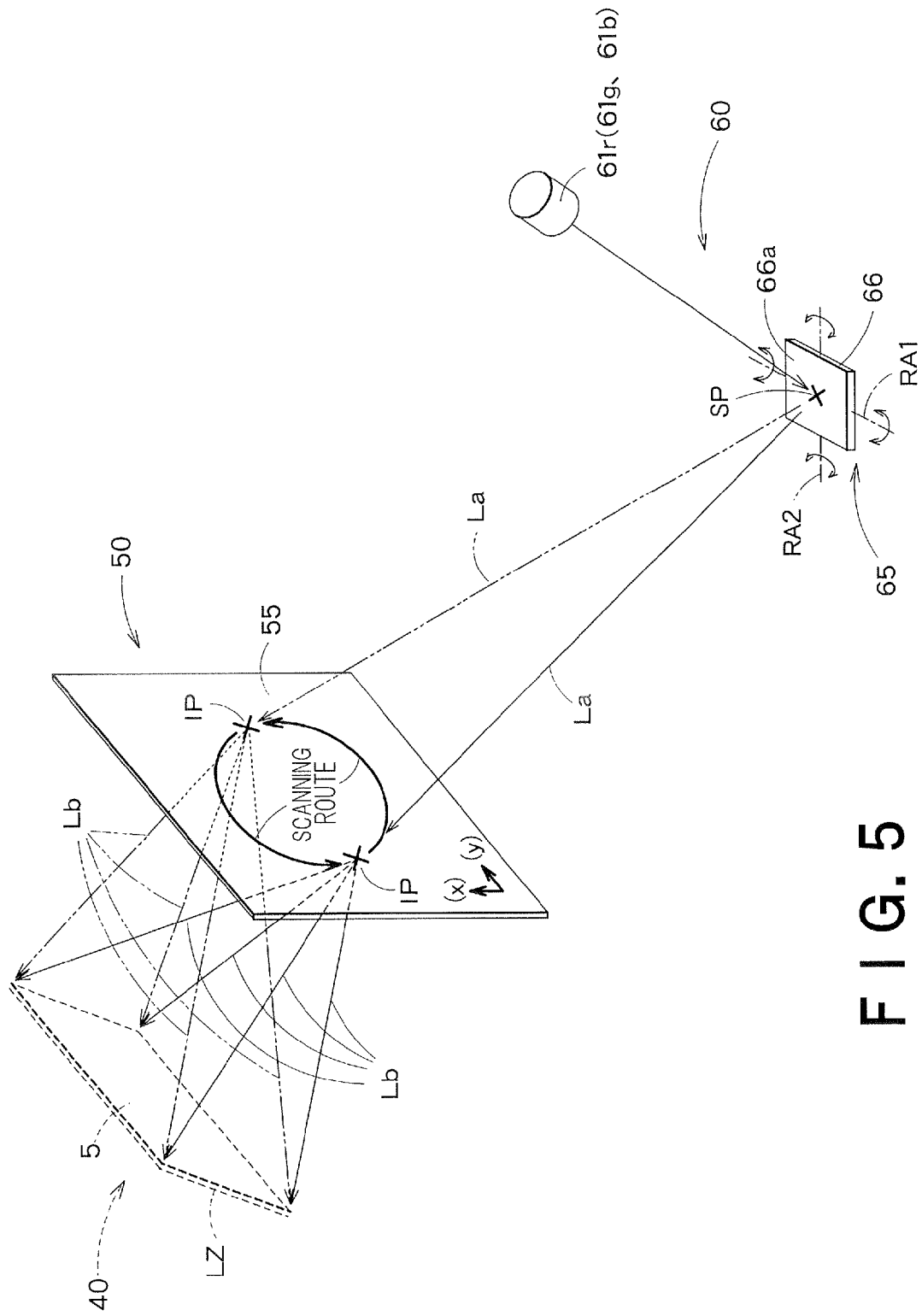
FIG. 5 is a view showing an example of rotating a mirror device 66 in a two-axis direction.

The embodiments described above have explained an example in which the irradiation unit 60 includes the laser source 61 and the scanning device 65. The scanning device 65 includes, for example, the one-axis-rotation type mirror device 66 that changes the propagation direction of a coherent light beam by reflection. However, the scanning device 65 is not limited thereto. As shown in FIG. 5, the scanning device 65 may be configured so that the mirror, i.e. reflection plane 66a, of the mirror device 66 can rotate about a first rotation axis line RA1 as well as about a second rotation axis line RA2 intersecting the first rotation axis line RA1. In the example shown in FIG. 5, the second rotation axis line RA2 of the mirror 66a is perpendicular to the first rotation axis line RA1 which is extended in parallel to the Y axis of the XY coordinate system defined on the plate plane of the hologram recording medium 55. Then, since the mirror 66a can rotate about both of the first axis line RA1 and the second axis line RA2, the incidence point IP of a coherent light beam of the irradiation unit 60 incident on the optical device 50 can be shifted on the plate plane of the hologram recording medium 55 in two-dimensional directions. Therefore, as an example, as shown in FIG. 5, the incidence point IP of a coherent light beam incident on the optical device 50 can be shifted along a circumference.

Moreover, the scanning device 65 may include two or more mirror devices 66. In this case, although the mirror 66a of the mirror device 66 can rotate about only a single axis line, the incidence point IP of a coherent light beam from the irradiation unit 60 incident on the optical device 50 can be shifted on the plate plane of the hologram recording medium 55 in two-dimensional directions.

As a concrete example of the mirror device 66a included in the scanning device 65, there are a MEMS mirror, a polygonal mirror, a galvano scanner, etc.

Moreover, the scanning device 65 may be configured to include other devices other than a reflection device, for example, the mirror device 66 described above, which changes the propagation direction of a coherent light beam by reflection. For example, the scan device 65 may include a refraction prism, a lens, etc.

Essentially, the scanning device 65 is not a necessary component. The light source 61 of the irradiation unit 60 may be configured so that they can be displaced, i.e. moved, oscillated, and rotated, with respect to the optical device 50. Coherent light beams emitted from the light source 61 may scan the hologram recording medium 55 in accordance with the displacement of the light source 61 with respect to the optical device 50.

Moreover, although the description hereinbefore is made on condition that the light sources 61 of the irradiation device 60 oscillate a laser beam shaped into a line beam, the preset invention is not limited thereto. Particularly, in the embodiments described above, coherent light beams emitted to respective positions of the optical device 50 are shaped by the optical device 50 into a light flux which is incident on the entire region of the illumination region LZ. Therefore, no problem occurs even if coherent light beams emitted from the light sources 61 of the irradiation device 60 to the optical device 50 are not accurately shaped. For this reason, coherent light beams generated from the light sources 61 may be diverging light. In addition, the shape of coherent light beams, in cross section, generated from the light sources 61 may be an ellipse or the like instead of a circle. In addition, the transverse mode of coherent light beams generated from the light sources 61 may be a multi-mode.

In addition, when the light source 61 generates a diverging light flux, coherent light beams are incident on the hologram recording medium 55 of the optical device 50 not on a spot but on a region having a certain area. In this case, light beams which are diffracted by the hologram recording medium 55 and incident on respective positions of the illumination region LZ are angle-multiplexed. In other words, in each instant, on respective positions of the illumination region LZ, coherent light beams are incident from directions within a certain angle range. Due to the angle-multiplexing, it is possible to more effectively make speckles inconspicuous.

Moreover, FIG. 1 shows an example in which coherent light beams reflected by the scanning device 65 are directly incident on the optical device 50. However, a condenser lens may be provided between the scanning device 65 and the optical device 50 to convert coherent light beams into a parallel light flux that is incident on the optical device 50. In this kind of example, instead of a converging light flux described above, a parallel light flux is used as the reference light beam Lr in the exposure process in the production of the hologram recording medium 55. The hologram recording medium 55 described above can be more simply produced and replicated.

(Optical Device 50)

In the embodiments described above, although the example in which the optical device 50 is configured with a reflection-type volume hologram recording medium 55 using photopolymer has been described, the present invention is not limited thereto. Moreover, the optical device 50 may include a volume hologram recording medium that is a type in which recording is performed by using a photosensitive medium including a silver halide material. Moreover, the optical device 50 may include a transmission-type volume hologram recording medium 55 or a relief-type, i.e. emboss-type hologram recording medium 55.

With respect to the relief-type, i.e. emboss-type, hologram recording medium, a hologram interference fringe is recorded using a convex-concave structure of the surface thereof. However, in the case of the relief-type hologram recording medium, scattering due to the convex-concave structure of the surface may cause generation of undesirable new speckles in addition to loss of intensity, hence in this respect, the volume hologram recording medium is preferable. In the case of the volume hologram recording medium, a hologram interference fringe is recorded as a refractive index modulation pattern, i.e. refractive index distribution, in an inner portion of the medium, hence there is no influence of scattering due to the convex-concave structure of the surface.

However, even when the volume hologram recording medium is used, a type in which recording is performed using a photosensitive medium including a silver halide material may become a cause of generating new speckles, in addition to loss of intensity, due to scattering of silver halide particles. In this respect, the volume hologram recording medium using a photopolymer is preferable as the hologram recording medium 55.

Moreover, in the recording process shown in FIG. 2, although a so-called Fresnel-type hologram recording medium 55 is produced, a Fourier transform-type hologram recording medium 55 which can be obtained through recording using lenses may be produced. When the Fourier transform-type hologram recording medium 55 is used, lenses can also be used for image reproduction.

In addition, a striped pattern, i.e. refractive index modulation pattern or convex-concave pattern, which is to be formed on the hologram recording medium 55 may be designed by using a computer based on a planned wavelength or incidence direction of a reproduction illumination light beam La, a shape or position of an image to be reproduced, and the like, without use of an actual object light beam Lo and reference light beam Lr. The hologram recording medium 55 obtained in this manner is also called a computer generated hologram recording medium. Moreover, when a plurality of coherent light beams having mutually different wavelength ranges are emitted from the irradiation unit 60 in a similar manner in the modification described above, the hologram recording medium 55 as a computer generated hologram recording medium may be partitioned two-dimensionally into a plurality of regions provided corresponding to coherent light beams of respective wavelength ranges so that the coherent light beams of the respective wavelength ranges are diffracted in the corresponding regions to reproduce images.

(Illuminating Method)

The embodiments described above has explained an example in which the irradiation unit 60 is configured to be able to scan the optical device 50 in a one-dimensional direction with coherent light beams and the hologram recording medium 55 of the optical device 50 is configured to diffuse the coherent light beams incident on respective positions of the hologram recording medium 55 in a two-dimensional direction, so that the illumination device 40 illuminates the two-dimensional illumination region LZ. However, as described above, the present invention is not limited to such example. For example, the irradiation unit 60 may be configured to be able to scan the optical device 50 in a two dimensional direction with coherent light beams and the hologram recording medium 55 of the optical device 50 may be configured to diffuse the coherent light beams incident on respective positions of the hologram recording medium 55 in a two-dimensional direction, so that the illumination device 40 illuminates the two-dimensional illumination region LZ, as shown in FIG. 5.

Moreover, as already described, the irradiation unit 60 may be configured to be able to scan the optical device 50 in a one-dimensional direction with coherent light beams and the hologram recording medium 55 of the optical device 50 may be configured to diffuse the coherent light beams incident on respective positions of the hologram recording medium 55 in a one-dimensional direction, so that the illumination device 40 illuminates the one-dimensional illumination region LZ. In this configuration, the scanning direction of a coherent light beam from the irradiation unit 60 and the diffusing direction by the hologram recording medium 55 of the optical device may be parallel with each other.

Furthermore, the irradiation unit 60 may be configured to be able to scan the optical device 50 in a one- or two-dimensional direction with coherent light beams and the hologram recording medium 55 of the optical device 50 may be configured to diffuse the coherent light beams incident on respective positions of the hologram recording medium 55 or the lens array in a one-dimensional direction.

In this configuration, the optical device 50 may have a plurality of hologram recording media 55 to illuminate illumination zones LZ corresponding to the hologram recording media 55 successively, so that illumination device 40 illuminates a two-dimensional region. In this occasion, the illumination zones LZ may be successively illuminated at a speed felt like as if simultaneously illuminated for human eyes or at a low speed so that human eyes can recognize that the illumination zones LZ are successively illuminated.

As described above, in the projection apparatus 20 according to the present embodiment, the hologram recording medium 55 is scanned by the scanning device 65 with coherent light beams so that coherent light beams scattered by the hologram recording medium 55 illuminate the illumination zone LZ, and using the illuminating light beams to the illumination zone LZ, the reflection angle of each micromirror of the DMD is controlled to project a modulated image onto the projection screen 15.

Accordingly, the ratio of coherent light beams not used for illumination of the illumination zone LZ to coherent light beams scattered by the hologram recording medium 55 is lowered to improve illumination intensity to the illumination zone LZ.

Especially, in the present embodiment, the reflection angle of each micromirror of the DMD is controlled at irregular adjusting timing for each frame period. Thus, even at a low gradient level, the projection screen is illuminated at a random timing for each frame period. Therefore, speckles are prevented from being generated, which are otherwise generated when the timing at which the reflection angle of each micromirror is controlled is constant for every frame period. This kind of speckles causes a problem, especially, when the gradient level is low. However, in the present embodiment, speckles become inconspicuous irrespective of the gradient level.

Moreover, according to the present embodiment described above, the optical device 50 for making speckles inconspicuous can also function as an optical member for shaping and adjusting the beam shape of a coherent light beam emitted from the irradiation unit 60. Therefore, it is possible to miniaturize and simplify the optical system.

Moreover, according to the present embodiment described above, coherent light beams incident on a specific position of the hologram recording medium 55 create light information of each color in the entire region of the illumination zone LZ. Therefore, it is possible to use all of the light beams diffracted by the hologram recording medium 55 for illumination. The present embodiment is also excellent in utility efficiency of light beams from the laser sources 61.

The present invention is not limited to the embodiments described above but includes various modifications conceivable by those skilled in the art. The effects of the present invention are also not limited to those described above. Namely, various additions, modifications and partial omissions may be made without departing from the conceptual idea and gist of present invention derived from those defined in the accompanying claims and their equivalents.

The invention claimed is:

1. A projection apparatus comprising:
an optical device configured to diffuse coherent light beams;
an irradiation unit configured to irradiate coherent light beams to the optical device so that the coherent light beams scan the optical device;
a light modulator configured to generate a modulated image using coherent light beams incident on and diffused at respective points of the optical device from the irradiation unit; and
a projection optical system configured to project a modulated image generated by the light modulator onto a scattering plane, the modulated image being a two-dimensional image,
wherein the light modulator comprises:
a plurality of micromirrors provided for each pixel, configured to switch a reflection angle of each coherent light beam from the optical device; and
a reflection angle controller including a pulse width modulation generator and a random number generator configured to adjust a reflection angle of each of the plurality of micromirrors for each frame period so that each timing at which the modulated image is begun to be projected onto the scattering plane is random for each frame period, the frame period being a time unit to generate the modulated image,
wherein the pulse width modulation generator comprises a plurality of image gradient storages which store image gradient data in accordance with the modulated image, each image gradient storage being provided corresponding to a different pulse width,
the random number generator generates the random number for each frame period,
the plurality of image gradient storages are reordered at random based on the random number for each frame period, and
the reflection angle controller adjusts the reflection angle of each of the plurality of micromirrors based on a pulse width modulation signal generated by the image gradient data stored in the plurality of image gradient storages read out on an alignment order of the plurality of image gradient storages for each frame period and the pulse widths corresponding to each of the plurality of image gradient storages.

2. The projection apparatus of claim 1, wherein the reflection angle controller controls a timing incident coherent light beams reflected by each of the plurality of micromirrors on the projection optical system so that the timing is random for each frame period.

3. The projection apparatus of claim 1, wherein the irradiation unit makes a plurality of coherent light beams of different wavelength ranges scan on the optical device while switching the plurality of coherent light beams sequentially in one frame period, and
the reflection angle controller controls a timing of switching a reflection angle of each of the plurality of micromirrors so that the timing is random for each frame period for each of the plurality of coherent light beams.

4. The projection apparatus of claim 3, wherein a plural number of micromirrors are provided for each pixel among the plurality of micromirrors,
the plurality of coherent light beams of different wavelength ranges are incident on the plural number of micromirrors provided for each pixel, respectively, and the reflection angle controller controls a timing at which a reflection angle of a micromirror that corresponds to each of the plurality of coherent light beams is switched so that the timing is random for each frame period.

5. The projection apparatus of claim 1, wherein the irradiation unit makes a plurality of coherent light beams of different wavelength ranges simultaneously scan on the optical device, the light modulator comprises a plurality of light modulating units on which a plurality of coherent light beams of different wavelength ranges diffracted by the optical device are incident, respectively, each of the plurality of light modulating units comprises the plurality of micromirrors, and the reflection angle controller controls a timing at which a reflection angle of each of the plurality of micromirrors that corresponds to each of the plurality of light modulating units is switched so that the timing is random for each frame period.

6. The projection apparatus of claim 1, wherein the optical device is a hologram recording medium, each point on the hologram recording medium being capable of reproducing an image on a position of the light modulator.

7. The projection apparatus of claim 1, wherein the optical device is a microlens array.

8. The projection apparatus of claim 1, wherein the irradiation unit comprises:

a plurality of light sources configured to emit coherent light beams of different wavelength ranges; and a scanning device configured to change a propagation direction of the coherent light beams emitted from the plurality of light sources and make the coherent light beams scan on the optical device.

* * * * *